United States Patent
Sanders et al.

(10) Patent No.: US 7,775,670 B2
(45) Date of Patent: Aug. 17, 2010

(54) LASER PROJECTION SYSTEM

(75) Inventors: Renatus Hendricus Maria Sanders, Eindhoven (NL); Johannus Wilhelmus Weekamp, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 633 days.

(21) Appl. No.: 11/573,915

(22) PCT Filed: Aug. 25, 2005

(86) PCT No.: PCT/IB2005/052787
§ 371 (c)(1),
(2), (4) Date: Feb. 19, 2007

(87) PCT Pub. No.: WO2006/024998
PCT Pub. Date: Mar. 9, 2006

(65) Prior Publication Data
US 2008/0278692 A1 Nov. 13, 2008

(30) Foreign Application Priority Data
Aug. 30, 2004 (EP) .................. 04104148

(51) Int. Cl.
*G03B 21/00* (2006.01)

(52) U.S. Cl. .................. 353/122; 353/98; 353/100; 359/259; 359/665; 359/666; 359/667; 359/577; 372/22; 372/99; 372/103

(58) Field of Classification Search ......... 359/205, 359/577, 620, 667, 900, 259, 665, 666; 372/22, 372/99, 103; 353/98, 100, 122
See application file for complete search history.

(56) References Cited

U.S. PATENT DOCUMENTS

| 5,272,473 | A | 12/1993 | Thompson et al. |
| 6,069,739 | A | 5/2000 | Borodovsky et al. |
| 6,594,090 | B2 | 7/2003 | Kruschuritz et al. |
| 6,629,641 | B2 | 10/2003 | Tsikos et al. |
| 2001/0007510 | A1 | 7/2001 | Dorsel et al. |
| 2002/0024714 | A1 | 2/2002 | Sandstrom et al. |
| 2002/0044346 | A1 | 4/2002 | Nguyen et al. |
| 2002/0126981 | A1 | 9/2002 | Roddy et al. |
| 2006/0209374 | A1* | 9/2006 | Willemsen .................. 359/205 |

FOREIGN PATENT DOCUMENTS

| JP | 01152411 | 6/1989 |
| JP | 05173094 | 7/1993 |
| JP | 11101925 | 4/1999 |
| JP | 2000268603 | 9/2000 |
| JP | 2002267825 | 9/2002 |
| WO | 03069380 A1 | 8/2003 |
| WO | 2005006720 A | 1/2005 |

* cited by examiner

*Primary Examiner*—Georgia Y Epps
*Assistant Examiner*—Sultan Chowdhury

(57) ABSTRACT

The present invention relates to a laser projection system (1) having means for reducing the coherence of a generated laser beam (3) in order to reduce the occurrence of annoying speckle artifacts in images produced by the system. Coherence is reduced by letting the laser beam (3) pass through a transparent cell (6) comprising first (A) and second (B) immiscible fluids having different refractive indices. The fluids are displaced in the cell, preferably using an electrowetting technique. The cell (6) may thus be realized as an electrowetting lens, which is driven with a pseudo random driving signal.

5 Claims, 2 Drawing Sheets

LASER PROJECTION SYSTEM

FIELD OF THE INVENTION

The present invention relates to a laser projection system, comprising a laser light source for generating a laser beam, means for projecting the laser beam onto a surface, and speckle reduction means for reducing speckle artifacts.

BACKGROUND OF THE INVENTION

Such a system is described in U.S. Pat. No. B1, 6,594,090. The speckle reduction means of this system comprises a moveable diffuser which is driven e.g. by an electric motor. The diffuser reduces the coherence of the laser beam and thus speckle artifacts which otherwise occur when the laser light is incident on a rough surface, such as e.g. paper.

The described system, however, is quite complex and expensive due to the additional moveable mechanical parts needed in the speckle reduction means.

SUMMARY OF THE INVENTION

It is therefore an object of the present invention to provide a less complex laser projection system which is still capable of substantially reducing annoying speckle artifacts.

This object is achieved by means of a laser projection system according to claim 1.

More specifically, the invention relates to a laser projection system, comprising a laser light source for generating a laser beam, means for projecting the laser beam onto a surface, and speckle reduction means for reducing speckle artifacts, wherein said speckle reduction means comprises a transparent cell, arranged in the path of the laser beam, said cell comprising first and second immiscible fluids, having different refractive indices, and control means for controlling the positions of the first and second fluids in the cell in order to vary the optical path length of the laser beam when propagating through the cell.

This arrangement allows the coherence of the laser beam in time to be altered without the provision of mechanical moveable parts, which provides a less complex and expensive system capable of sufficient speckle reduction. Such a system will also be less bulky than a system with a moving diffuser, and will consume less power. A small, low power system may thus be achieved.

Preferably, the control means controls the positions of the first and second fluids based on an electrowetting effect. The speckle reduction means may thus comprise an electrowetting lens. The deflecting properties of the lens need not be used, only the ability to vary the optical path length, which may be well defined.

The electrowetting lens is preferably provided with a pseudo random control signal. This eliminates the risk that the speckle reduction itself becomes visible in an image.

Preferably the path length varies more than $\lambda/4$, where $\lambda$ is the wavelength of the light produced by the light source. This provides a suitable variation for reducing the visual annoyance of speckle.

These and other aspects of the invention will be apparent from and elucidated with reference to the embodiments described hereinafter.

DESCRIPTION OF PREFERRED EMBODIMENTS

The present invention relates to laser projection system having means for reducing the coherence, in time, of a laser light beam in order to reduce annoying speckle patterns in an image generated by the system.

Speckle is a phenomenon occurring when a highly coherent light beam, such as a laser beam, is scattered by a surface with random surface properties, such as paper, fabric or a painted wall. Different parts of the scattered light add up to a strongly fluctuating light pattern, due to interference resulting in intensity peaks and valleys.

Figure 1:
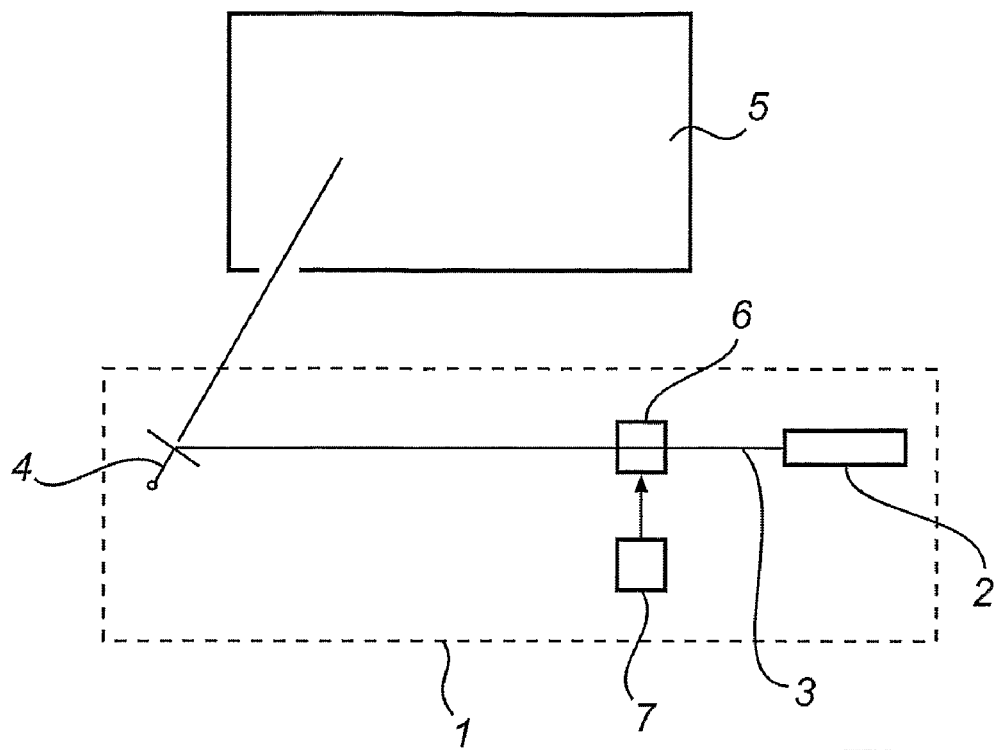
FIG. 1 illustrates schematically a laser projection system according to an embodiment of the invention.

FIG. 1 illustrates schematically a laser projection system 1 according to an embodiment of the invention.

The system comprises a laser light source 2 for generating a laser beam 3 and projection means 4 for projecting the laser beam onto a surface 5.

The light source 2 may be any kind of laser suitable for illumination, such as for instance a frequency doubled Nd-YAG laser, an Argon-Ion laser or a laser diode. The projection means 4 may e.g. comprise a moveable mirror for projecting the laser beam 3 along a predetermined path on the surface 5, thus producing an image comprising, for instance, text. In that case the mirror is preferably combined with a shutter (not shown) in order to modulate the laser light beam. Of course, many other types of projection means may be used, such as sweeping projection means producing an image comprising a number of lines similarly to a normal television apparatus, and projection means comprising liquid crystal modulators. In general, any kind of projection means is conceivable according to the invention as long as a highly coherent light source is used and there is a need for the reducing of speckle artifacts.

As illustrated in FIG. 1, the surface 5 on which an image is projected is not considered to be comprised in the projection system 1. The surface 5 may be e.g. an interior or exterior wall of a building, a paper or fabric sheet or the like.

The laser projection system further comprises speckle reduction means 6, 7 for reducing the coherence of the laser beam 3, in order to reduce speckle artifacts. The speckle reduction means 6, 7 comprises a transparent cell 6 and means 7 for controlling and varying the optical path length of the laser beam 3 when propagating through the cell 6.

When the optical path length varies, the coherence of the light beam is reduced, not in space, but in time. This means that the phase of the light varies substantially over time, but that the light beam is instantaneously coherent at any point along its path. This provides an effect that corresponds to vibrating the projection surface 5 in the direction of its normal.

The optical path length is varied by displacing first and second fluids with different refractive indices in the cell 6. By doing this, the distance the laser beam 3 travels through the fluid with the highest refractive index can be made to vary. Preferably, the displacing is carried out using the known electrowetting effect. An example of a cell 6 provided in this way will now be described.

Figure 2:
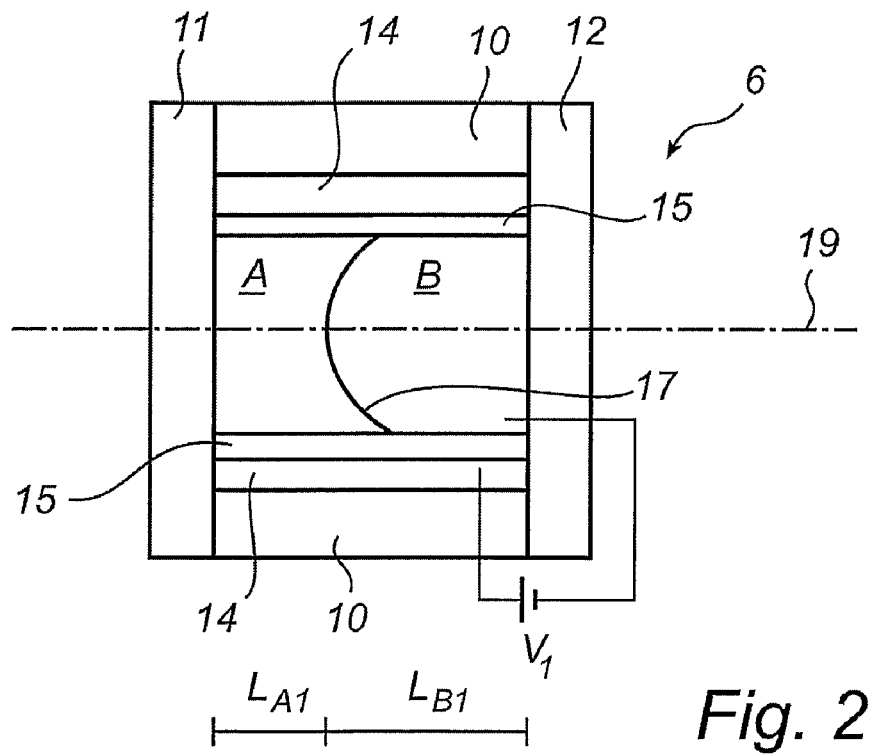
FIG. 2 illustrates an electrowetting lens in a first state.

FIG. 2 illustrates an electrowetting lens in a first state. The lens constitutes a cell 6 forming part of a speckle reduction means. Electrowetting lenses are known per se, see WO, A1, 03/069380.

The lens comprises a tubular side wall part 10 and first and second transparent end walls 11, 12, together defining a cylindrical, closed space. The interior of the side wall part 10 is covered with an electrode layer 14, e.g. a metal layer. The electrode layer is covered by a hydrophobic, insulating layer 15, such as Teflon™ AF1600 (DuPont™).

Said closed space is filled with first A and second B fluids, which are immiscible with each other and have different refractive indices $n_A$ and $n_B$, respectively. The first fluid A is electrically insulating, e.g. a silicone oil or an alkane. The second fluid B is conductive and polar, e.g. a salt water solution. Preferably, the first and second fluids have equal densities.

In the state illustrated in FIG. 2, a low or zero voltage $V_1$ is applied between the second fluid B and the electrode 14. The cell is thus relaxed. In this state, the second fluid B, being polar, will cover as little of the hydrophobic layer 15 as possible, which means that the interface 17 between the first A and second B fluids will bulge towards the left end wall 11. A laser beam, travelling along the central path 19 will thus travel the distance $L_{A1}$ through the first fluid A and the distance $L_{B1}$ through the second fluid B. The total optical path length will thus be $L_{A1}*n_A + L_{B1}*n_B$. Note that the deflecting properties of the lens are not used in this application.

Figure 3:
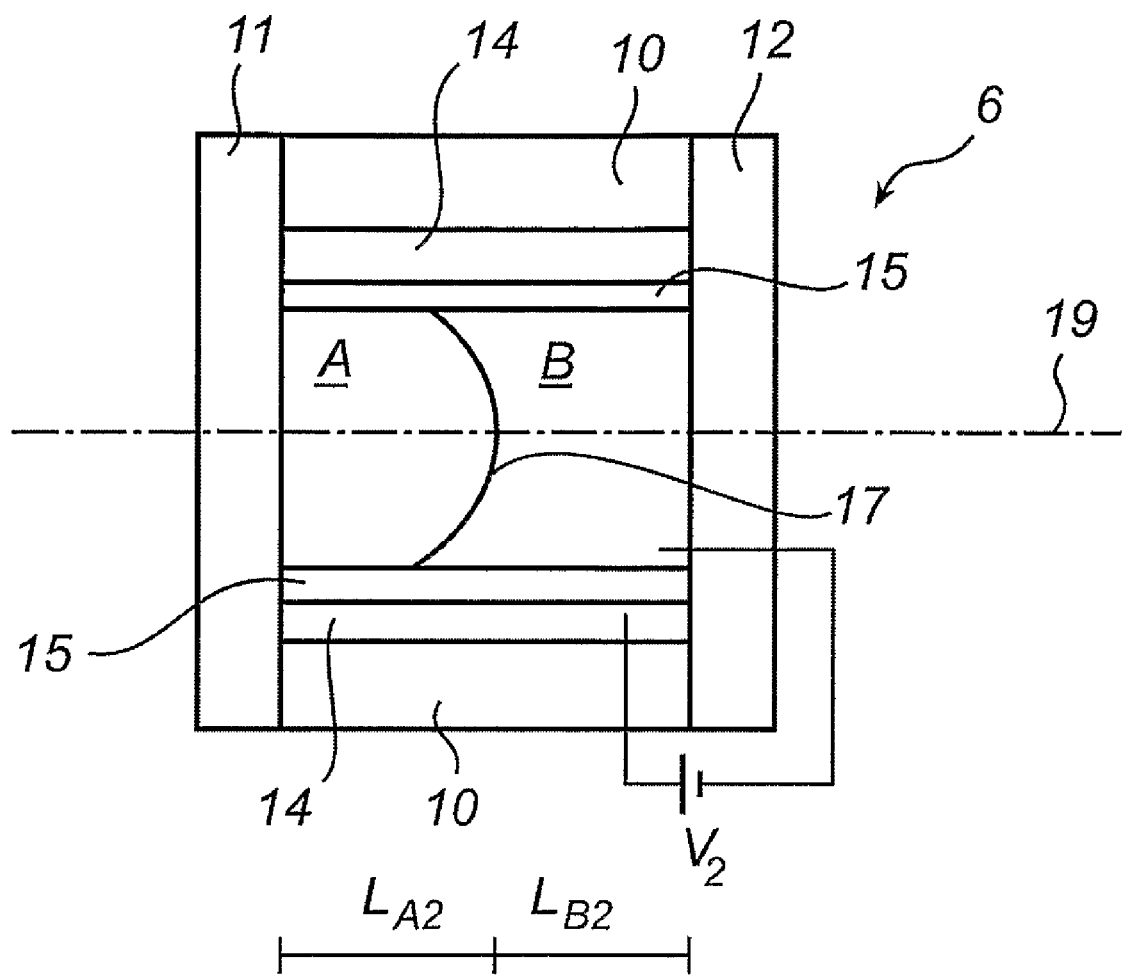
FIG. 3 illustrates the electrowetting lens in a second state.

FIG. 3 illustrates the electrowetting lens in a second state. In this state a second, higher voltage $V_2$ is applied between the second fluid B and the electrode 14. Only a very small leakage current will flow in this circuit, since the hydrophobic layer 15 is insulating, but the applied voltage now forces the second, conductive fluid B to cover a greater part of the hydrophobic layer 15. The interface 17 between the first and second fluids thus flexes and begins to bulge instead towards the right end wall 12. Therefore, a laser beam, travelling along the central path 19 will now travel the distance $L_{A2}$ through the first fluid A and the distance $L_{B2}$ through the second fluid B. The total optical path length will now be $L_{A2}*n_A + L_{B2}*n_B$.

In accordance with an embodiment of the invention, the lens, constituting a cell 6, is controlled by a control unit 7 to alternate between the state of FIG. 2 and the state of FIG. 3. The optical path length difference $\Delta d$ will thus be $(L_{A1}*n_A + L_{B1}*n_B) - (L_{A2}*n_A + L_{B2}*n_B)$. Of course, more than two states may be used or the optical path length may be caused to vary continuously. Preferably, $\Delta d$ should be greater than $\lambda/4$ where $\lambda$ is the wavelength of the laser light. To be visible to the human eye, a speckle pattern must be constant over about 0.1 second. To reduce annoying speckle patterns, the path length should be varied with a frequency higher than 10 Hz, preferably higher than 50 Hz. Preferably a pseudo random driving signal is used to control the optical path length. This avoids a risk that the coherence reduction itself becomes visible to a user. One or more of the amplitude, the frequency and the phase of the driving signal may have random properties.

In summary, the present invention relates to a laser projection system having means for reducing the coherence of a generated laser beam in order to reduce the occurrence of annoying speckle artifacts in images produced by the system. Coherence is reduced by letting the laser beam pass through a transparent cell comprising first and second immiscible fluids having different refractive indices. The fluids are displaced in the cell, preferably using an electrowetting technique. The cell may thus be realized as an electrowetting lens, which is driven with a pseudo random driving signal.

The invention is not restricted to the described embodiment. It can be altered in different ways within the scope of the appended claims.

The invention claimed is:

1. A laser projection system comprising:
   a laser light source for generating a laser beam;
   means for projecting the laser beam onto a surface; and
   speckle reduction means for reducing speckle artifacts appearing on the surface due to incidence of the laser beam, wherein said speckle reduction means comprises:
   a transparent cell arranged in a path of the laser beam, said transparent cell comprising first and second immiscible fluids having different refractive indices; and
   control means coupled to said transparent cell for controlling positions of the first and second immiscible fluids in the cell in order to vary an optical path length of the laser beam when propagating through the cell.

2. The laser projection system as claimed in claim 1, wherein the control means controls the positions of the first and second immiscible fluids based on an electrowetting effect.

3. The laser projection system as claimed in claim 2, wherein the speckle reduction means comprises an electrowetting lens.

4. The laser projection system as claimed in claim 3, wherein the electrowetting lens is provided with a pseudo random control signal.

5. The laser projection system as claimed in claim 1, wherein said control means varies the optical path length more than •/4, where • is the wavelength of the laser beam produced by the light source.

* * * * *